United States Patent
Fukiage et al.

(10) Patent No.: US 8,419,859 B2
(45) Date of Patent: Apr. 16, 2013

(54) METHOD OF CLEANING PLASMA-TREATING APPARATUS, PLASMA-TREATING APPARATUS WHERE THE CLEANING METHOD IS PRACTICED, AND MEMORY MEDIUM MEMORIZING PROGRAM EXECUTING THE CLEANING METHOD

(75) Inventors: Noriaki Fukiage, Amagasaki (JP); Shinji Komoto, Amagasaki (JP); Hiroyuki Takaba, Hillsboro, OR (US); Kiyotaka Ishibashi, Amagasaki (JP)

(73) Assignee: Tokyo Electron Limited (JP)

( * ) Notice: Subject to any disclaimer, the term of this patent is extended or adjusted under 35 U.S.C. 154(b) by 592 days.

(21) Appl. No.: 12/528,734

(22) PCT Filed: Feb. 18, 2008

(86) PCT No.: PCT/JP2008/052650
§ 371 (c)(1),
(2), (4) Date: Feb. 23, 2010

(87) PCT Pub. No.: WO2008/105255
PCT Pub. Date: Sep. 4, 2008

(65) Prior Publication Data
US 2010/0175713 A1 Jul. 15, 2010

(30) Foreign Application Priority Data
Feb. 27, 2007 (JP) ................. 2007-048124

(51) Int. Cl.
*B08B 7/00* (2006.01)
(52) U.S. Cl.
USPC .............. 134/1.1; 134/18; 134/22.1; 134/26
(58) Field of Classification Search .............. 34/1.1, 34/18, 21, 22.1, 22.18, 26; 15/1; 156/345.51, 156/345.37
See application file for complete search history.

(56) References Cited

U.S. PATENT DOCUMENTS 5,417,826 A  5/1995  Blalock

FOREIGN PATENT DOCUMENTS

| JP | 03-191073 | 8/1991 |
|----|-----------|--------|
| JP | 04-214873 | 8/1992 |
| JP | 05-343334 | 12/1993 |
| JP | 09-181052 | 7/1997 |

(Continued)

OTHER PUBLICATIONS

Japanese Office Action—Japanese Application No. 2007-048124 issued on Oct. 11, 2011, citing JP 2007-142018.
Korean Office Action—Korean Application No. 10-2009-7016989 issued on Nov. 19, 2011, citing KR 10-2005-0087807 and KR 10-2006-0085953.
Notice of Grounds of Rejection issued by Japan Patent Office on Jan. 4, 2011, citing JP2006-004962 and JP2006-351814 which were previously submitted.

(Continued)

*Primary Examiner* — Eric Golightly
(74) *Attorney, Agent, or Firm* — Cantor Colburn LLP

(57) ABSTRACT

A method of cleaning a plasma processing apparatus for processing a target in a process container, which is vacuum-evacuatable, using plasma, includes performing a first cleaning process by supplying a cleaning gas into the process container to generate plasma and maintaining the pressure in the process container at a first pressure, and performing a second cleaning process by supplying a cleaning gas into the process container to generate plasma and maintaining the pressure in the process container at a second pressure that is higher than the first pressure. Accordingly, the plasma processing apparatus can be efficiently and rapidly cleaned without damaging at least one of the group consisting of inner surfaces of the process container and members in the process container.

8 Claims, 6 Drawing Sheets

FOREIGN PATENT DOCUMENTS

| | | |
|---|---|---|
| JP | 2000-003908 | 1/2000 |
| JP | 2003-332326 | 11/2003 |
| JP | 2004-039743 | 2/2004 |
| JP | 2006-004962 | 1/2006 |
| JP | 2006-086325 | 3/2006 |
| JP | 2006-351814 | 12/2006 |
| JP | 2007-142018 | 6/2007 |
| KR | 10-2005-0087807 | 8/2005 |
| KR | 10-2006-0085953 | 7/2006 |

OTHER PUBLICATIONS

Notice of Preliminary Rejection issued by Korean Intellectual Property Office on Mar. 8, 2011.

International Search Report—PCT/JP2008/052650 dated Mar. 11, 2008.

First Notice of Rejection Grounds issued by SIPO (Chinese Patent Office) on Jun. 9, 2010.

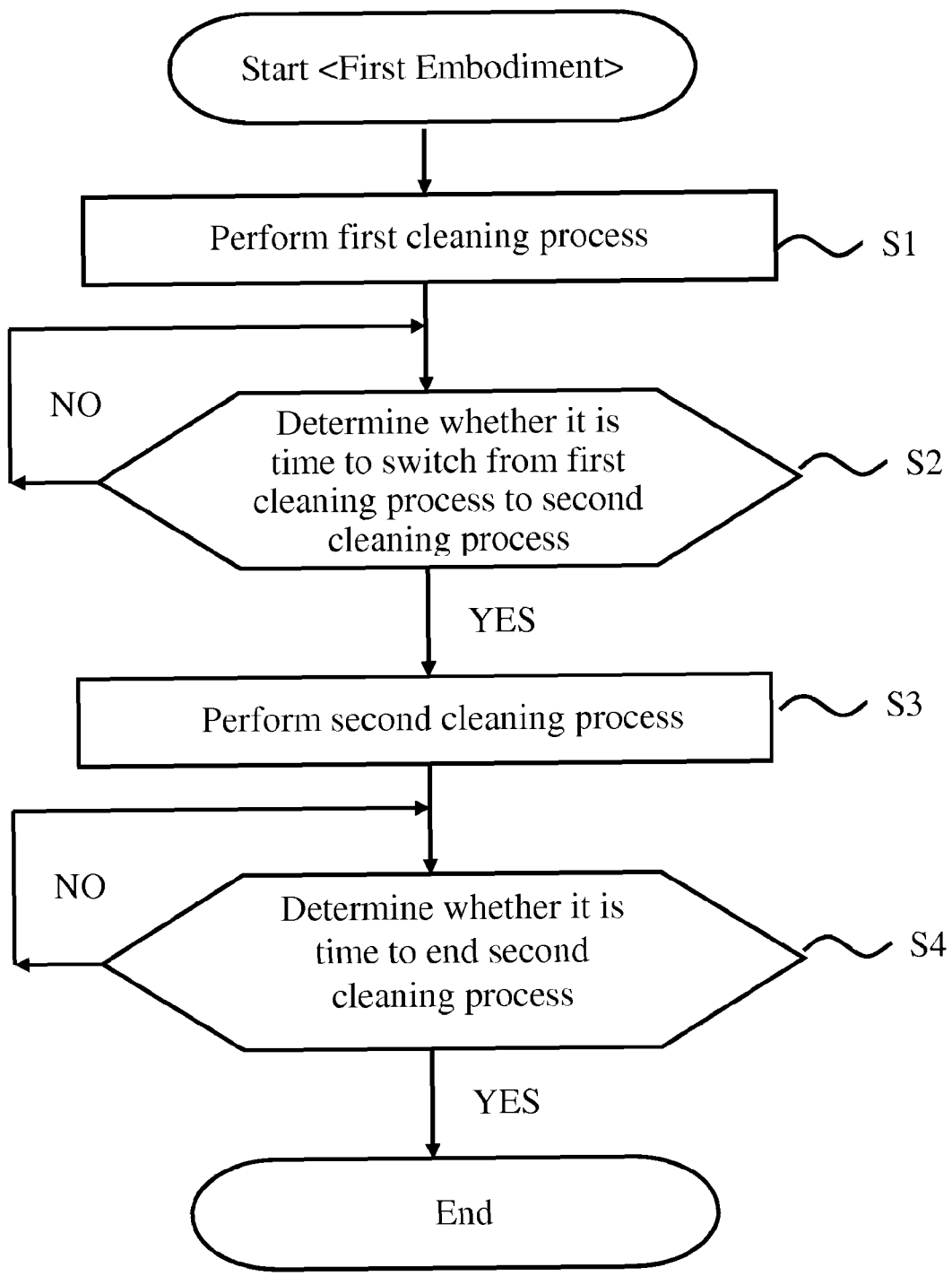

METHOD OF CLEANING PLASMA-TREATING APPARATUS, PLASMA-TREATING APPARATUS WHERE THE CLEANING METHOD IS PRACTICED, AND MEMORY MEDIUM MEMORIZING PROGRAM EXECUTING THE CLEANING METHOD

CROSS-REFERENCE TO RELATED APPLICATION

This application claims the benefit of Japanese Patent Application No. 2007-048124, filed on Feb. 27, 2007 in the Japan Patent Office, the disclosure of which is incorporated herein its entirety by reference.

BACKGROUND OF THE INVENTION

1. Technical Field

The present invention relates to a plasma processing apparatus for processing a semiconductor wafer or the like with plasma that is generated by microwaves or high frequency waves, and a method of cleaning the plasma processing apparatus.

2. Background Art

Plasma processing apparatuses for film formation, etching, and ashing have recently been used in the fabrication process of highly integrated semiconductor products. In particular, plasma processing apparatuses using microwaves or high frequency waves are frequently used because high density plasma can be stably generated even at a relatively low pressure (high vacuum state) of about 0.1 mTorr (13.3 mPa) to several 10 mTorr (several Pa).

Such plasma processing apparatuses are disclosed in Japanese Laid-Open Patent Publication No. hei 3-191073, Japanese Laid-Open Patent Publication No. hei 5-343334, Japanese Laid-Open Patent Publication No. hei 9-181052, Japanese Laid-Open Patent Publication No. 2000-3908, and Japanese Laid-Open Patent Publication No. 2003-332326. For example, a conventional plasma processing apparatus using microwaves will now be explained with reference to FIG. 5. FIG. 5 is a schematic view illustrating a configuration of a conventional plasma processing apparatus using microwaves.

Referring to FIG. 5, the conventional plasma processing apparatus 2 includes a holding stage 6 disposed in a process container 4 that can be vacuum evacuated, and allowing a semiconductor wafer W (hereinafter referred to as a wafer W) to be held thereon. A top plate 8 having a disk shape and formed of a microwave-transmissive material, such as aluminum nitride or quartz, is hermetically installed on the top of the process container 4 to face the holding stage 6. A shower head 9 for supplying a predetermined gas into the process container 4 is disposed in a sidewall of the process container 4.

A planar antenna member 10 that is disk-shaped and has a thickness of several millimeters (mm), and a wavelength-shortening member 12 formed of, for example, a dielectric material are installed over a top surface of the top plate 8. The wavelength-shortening member 12 is used to shorten the wavelength of microwaves in a radial direction of the planar antenna member 10. A plurality of slots 14, which are, for example, long and narrow through-holes, are formed in the planar antenna member 10. In general, the slots 14 are arranged in a concentric fashion or in a spiral fashion. A core conductor 18 of a coaxial waveguide 16 is connected to the center of the planar antenna member 10, so that microwaves having a frequency of, for example, 2.45 GHz generated by a microwave generator 20 are converted into a vibration mode by a mode converter 22, and then guided to the planar antenna member 10.

The microwaves guided to the planar antenna member 10 are propagated in the radial direction of the planar antenna member 10, radiated through the slots 14 formed in the planar antenna member 10, passed through the top plate 8, and supplied into the process container 4. Plasma is generated in a processing space S of the process container 4 by the microwaves, and predetermined plasma processing, such as etching or film formation, is performed on the wafer W using the plasma.

BRIEF SUMMARY OF THE INVENTION

Technical Problem

In such plasma processing as described above, since an undesired film, which causes particle generation and the like, is attached to inner surfaces of a process container 4 or a surface of a structure in the process container 4, such as a holding stage 6 or a shower head 9, during plasma processing, a cleaning process (dry cleaning) for removing the undesired film is performed by supplying a cleaning gas into the process container 4 regularly, for example, every time a wafer is processed or every time a predetermined number of wafers are processed, or irregularly.

If the undesired film is a CF-based film, $O_2$ gas may be used as the cleaning gas in the cleaning process, and if the undesired film is a Si-based film, $NF_3$ may is used. In order to improve cleaning efficiency, plasma is generated in the process container 4 to activate the cleaning gas, and the temperature in the process container 4 is increased. Also, the pressure in the process container 4 is a high pressure of about several Torr or a low pressure of about 100 mTorr, in general.

However, the pressure in the process container 4 during the cleaning process using the plasma affects cleaning results. In detail, the undesired film is not uniformly formed in the process container 4. That is, there are some places where the undesired film tends to be formed and other places where the undesired film is hardly formed, and also there are places where the undesired film can be easily removed and other places where the undesired film cannot be easily removed according to location or temperature. For example, if the pressure in the process container 4 is low during the cleaning process, since ions with electron temperature providing high cleaning performance mainly react with the undesired film, the undesired film can be easily removed by the collision with the ions, thereby increasing cleaning speed. However, the ions having high irradiation energy collides with a surface of a member from which the undesired film has been early removed, thereby leading to damage to the member.

On the contrary, if the pressure in the process container 4 is high during the cleaning process, since radicals (active species) providing low cleaning performance mainly react with the undesired film, even when the radical collides with a surface of a member from which the undesired film has been early removed, the member is rarely damaged, but cleaning speed is low.

To effectively solve the problems, the present invention provides a plasma processing apparatus that can perform efficient and rapid cleaning without damaging inner surfaces of a process container or a member in the process container, and a cleaning method in the plasma processing apparatus.

Technical Solution

According to an aspect of the present invention, there is provided a method of cleaning a plasma processing apparatus for processing a target in a process container, which is vacuum-evacuatable, using plasma, the method including: performing a first cleaning process by supplying a cleaning gas into the process container to generate plasma and maintaining the pressure in the process container at a first pressure; and performing a second cleaning process by supplying a cleaning gas into the process container to generate plasma and maintaining the pressure in the process container at a second pressure that is higher than the first pressure.

Since the first cleaning process is performed by supplying the cleaning gas into the process container to generate plasma and maintaining the pressure in the process container at the first pressure and the second cleaning process is performed by supplying the cleaning gas into the process container to generate plasma and maintaining the pressure in the process container at the second pressure that is higher than the first pressure, the plasma processing apparatus can be efficiently and rapidly cleaned without damaging the inner surfaces of the process container or members in the process container.

The second cleaning process may be performed after the first cleaning process. Accordingly, since the second cleaning process mainly using radicals having lower irradiation energy than ions is performed after the first cleaning process, the risk of damage to the inner surfaces of the process container or the members in the process container from which an undesired film is removed can be reduced more effectively.

Alternatively, the first cleaning process may be performed after the second cleaning process is performed.

The first pressure may range from 10 mTorr to a value less than 750 mTorr, and the second pressure may range from 750 mTorr to 5 Torr.

At least one of the group consisting of a sidewall of the process container and a holding stage on which the target is held may be heated.

A time to switch between the first cleaning process and the second cleaning process may be determined based on the total amount of plasma processing performed on the target before either the earlier first cleaning process or second cleaning process is performed.

A time to switch between the first cleaning process and the second cleaning process may be determined based on the amount of light emitted from plasma generated in the process container.

According to another aspect of the present invention, there is provided a plasma processing apparatus including: a process container that is vacuum-evacuatable; a holding stage disposed in the process container and allowing a target to be held thereon; a gas supplying unit supplying a gas into the process container; a plasma generating unit generating plasma in the process container; and a control unit controlling the plasma processing apparatus to execute the method.

The plasma processing apparatus may further include a heating unit disposed in at least one of the group consisting of a sidewall of the process container and the holding stage.

According to another aspect of the present invention, there is provided a computer-readable recording medium having embodied thereon a program for controlling a plasma processing apparatus to execute the method in order to clean the plasma processing apparatus, wherein the plasma processing apparatus includes: a process container that is vacuum-evacuatable; a holding stage disposed in the process container and allowing a target to be held thereon; a gas supplying unit supplying a gas into the process container; a plasma generating unit generating plasma in the process container; and a control unit controlling the overall operation of the plasma processing apparatus.

BRIEF DESCRIPTION OF THE SEVERAL VIEWS OF THE DRAWINGS

FIG. 2A is a flowchart illustrating a method of cleaning the plasma processing apparatus of FIG. 1, according to an embodiment of the present invention.

DETAILED DESCRIPTION OF THE INVENTION

Best Mode for Carrying Out the Invention

The present invention will now be described more fully with reference to the accompanying drawings, in which exemplary embodiments of the invention are shown.

Figure 1:
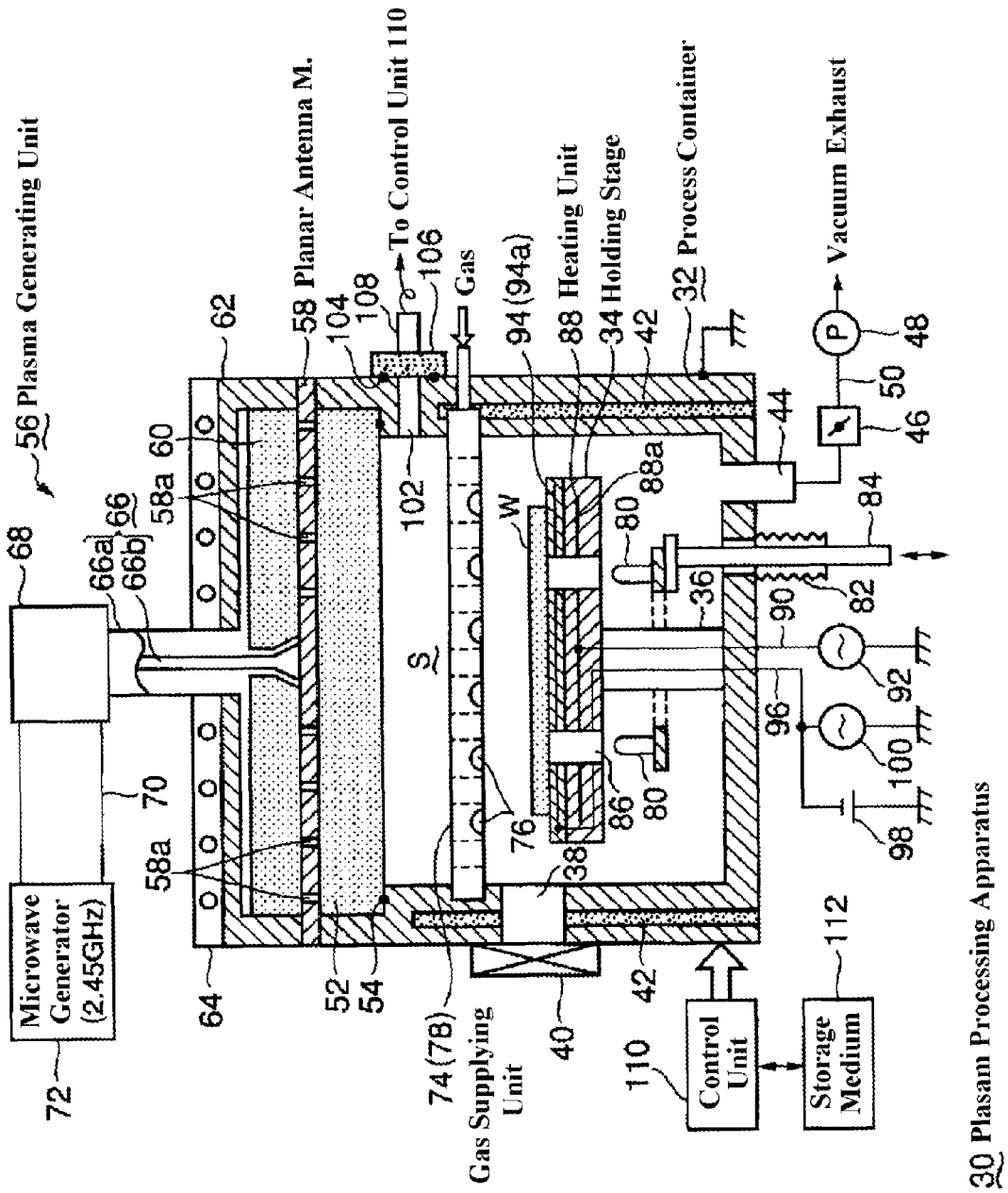
FIG. 1 is a schematic view illustrating a configuration of a plasma processing apparatus according to an embodiment of the present invention.

FIG. 1 is a view illustrating a configuration of a plasma processing apparatus 30 according to an embodiment of the present invention. It is assumed that the plasma processing apparatus 30 uses a radial line slot antenna (RLSA) as a planar antenna member 58.

Referring to FIG. 1, the plasma processing apparatus 30 includes a process container 32 that is cylindrical and has a sidewall or a bottom formed of a conductive material such as an aluminium alloy. A processing space S of the process container 32 is hermetical and plasma is generated in the processing space S. The process container 32 is electrically grounded.

A holding stage 34 having a top surface on which, for example, a semiconductor wafer W (hereinafter referred to as a wafer W) is held as a target to be processed is installed in the process container 32. The holding stage 34 has a substantially flat disk shape and is formed of a ceramic material such as alumina. The holding stage 34 is supported by a support 36 that is formed of, for example, aluminium, wherein the support 36 stands on the bottom of the process container 32.

An opening 38 is formed in the sidewall of the process container 32, and a gate valve 40 is installed at the opening 38. The gate valve 40 is opened and closed when the wafer W is carried in and out of the process container 32. A plurality of heater rods 42 constituting a heating unit are embedded in the sidewall of the process container 32, so that the sidewall of the process container 32 can be heated and the process container 32 can be maintained at a predetermined temperature if necessary. An exhaust port 44 is formed in the bottom of the process container 32, and an exhaust passage 50 on which a pressure regulating valve 46 and a vacuum pump 48 are sequentially provided is connected to the exhaust port 44, so that the process container 32 can be vacuum-evacuated and maintained at a predetermined pressure if necessary.

A top plate 52 formed of a microwave transmissive ceramic material, such as $Al_2O_3$, is hermetically installed on the open top of the process container 32 by means of a sealing member 54 such as an O-ring. The thickness of the top plate 52 may be determined to be about 20 mm in consideration of pressure resistance.

A plasma generating unit 56 for generating plasma in the process container 32 is disposed on a top surface of the top plate 52. In detail, the plasma generating unit 56 includes the planar antenna member 58 having a disk shape and is disposed on the top surface of the top plate 52. A wavelength-shortening member 60 is disposed on the planar antenna member 58. The wavelength-shortening member 60 is formed of, for example, aluminium nitride, and has high permittivity so as to shorten the wavelength of microwaves. The planar antenna member 58 constitutes a bottom plate of a waveguide box 62 that has a hollow cylindrical shape, is formed of a conductive material, and covers the entire top surface of the wavelength-shortening member 60. A cooling jacket 64 for supplying a coolant in order to cool the waveguide box 62 is disposed on the waveguide box 62.

An outer pipe 66a of a coaxial waveguide 66 is connected to the center of the waveguide box 62, and a core conductor 66b passes through a central through-hole of the wavelength-shortening member 60 and is connected to the center of the planar antenna member 58. The coaxial waveguide 66 is connected to a microwave generator 72, which has a matching function (not shown) and generates microwaves having a frequency of, for example, 2.45 GHz, through a mode converter 68 and a rectangular waveguide 70, and propagates the microwaves to the planar antenna member 58. The microwaves are not limited to a frequency of 2.45 GHz, and may have other frequencies, for example, 8.35 GHz.

If the planar antenna member 58 corresponds to the wafer W having a diameter of 300 mm, the planar antenna member 58 may be formed of a conductive material having a diameter of about 400 to 500 mm and a thickness of about 1 to several millimeters (mm), and may have a surface formed of a silver-plated copper plate or an aluminium plate. A plurality of slots 58a, which are, for example, long and narrow holes are formed in the disk shaped planar antenna member 58. The slots 58a may be arranged, but not limited to, in a concentric, spiral, or radial fashion, or may be uniformly formed in the entire surface of the planar antenna member 58. Since the planar antenna member 58 is a RLSA, high-density plasma and low electron energy can be obtained.

A gas supplying unit 74 for supplying a gas required during plasma processing or cleaning into the process container 32 at a controlled flow rate is disposed over the holding stage 34. In detail, the gas supplying unit 74 includes a shower head unit 78 obtained by forming a lattice-shaped gas flow path and forming a plurality of gas injection holes 76 in the gas flow path. The gas can be vertically supplied through the gas injection holes 76 of the shower head unit 78 into the processing space S of the process container 32. The entire shower head unit 78 may be formed of quartz, aluminium, or the like in order to maintain durability against the cleaning gas. In particular, when the cleaning gas is a halogen-based gas, the shower head unit 78 may be formed of quartz.

A plurality of, for example, three, elevation pins 80 although two elevation pins 80 are illustrated in FIG. 1 for elevating the wafer W when the wafer W is carried in and out of the process container 32, are disposed under the holding stage 34. The elevation pins 80 are elevated by an elevation rod 84, which passes through the bottom of the process container 32, with the help of an elastic bellows 82. Pin insertion through-holes 86 into which the elevation pins 80 are inserted are formed in the holding stage 34. The holding stage 34 is formed of a heat resistant material, for example, a ceramic such as alumina. A heating unit 88 is formed in the holding stage 34. The heating unit 88 includes a resistance heater 88a that has a thin plate shape and is embedded in the holding stage 34 substantially along the length of the holding stage 34.

The resistance heater 88a is connected to a power supply 92 through a wire 90 that passes through the support 36.

An electrostatic chuck 94, which is thin and has a mesh-shaped chuck electrode 94a, is disposed on the top surface of the holding stage 34. The wafer W held on the holding stage 34, specifically, on the electrostatic chuck 94 is attached to the holding stage 34 due to an electrostatic adsorption force of the electrostatic chuck 94. The chuck electrode 94a of the electrostatic chuck 94 is connected to a direct current (DC) supply 98 through a wire 96 in order to provide the electrostatic adsorption force. A high frequency power supply 100 for biasing is also connected to the wire 96 in order to apply a high frequency power for biasing at a frequency of, for example, 13.56 MHz, to the chuck electrode 94a of the electrostatic chuck 94 during plasma processing.

An observation opening 102 is formed in an upper portion of the sidewall of the process container 32, and an observation window 106 formed of a quartz plate or the like is hermetically attached to the observation opening 102 by means of a sealing member 104 such as an O-ring. A light receiver 108 is provided outside the observation window 106, so as to detect the amount of light emitted from plasma. The observation window 106 or the light receiver 108 may be omitted.

The operation of the plasma processing apparatus 30 is controlled by a control unit 110 including a computer and the like. A program of the computer for performing the operation is stored in a storage medium 112 such as a floppy disk, a compact disc (CD), a hard disk, or a flash memory. In detail, control of the supply or flow of each gas, control of the supply or power of microwaves or high frequency waves, control of a process temperature, control of a process pressure, and control based on the amount or the like of light detected by the receiver 108 are performed by the control unit 110.

A plasma film forming method using the plasma processing apparatus 30, and a method of cleaning the plasma processing apparatus 30 using plasma, will now be explained.

The plasma film forming method will be first explained. The wafer W is carried into the process container 32 by a transfer arm (not shown) through the gate valve 40, is held on the top surface of the holding stage 34 by vertically moving the elevation pins 80, and is attached to the holding stage 34 due to the electrostatic force of the electrostatic chuck 94.

The wafer W is heated to a predetermined process temperature by the heating unit 88 of the holding stage 34 and maintained at the predetermined process temperature. A material gas for film formation or a gas for exciting plasma is supplied at a predetermined flow rate from the shower head unit 78 into the process container 32, and the pressure in the process container 32 is maintained at a predetermined pressure by controlling the pressure regulating valve 46. At the same time, the microwave generator 72 of the plasma generating unit 56 is driven to generate and supply microwaves to the planar antenna member 58 through the rectangular waveguide 70 and the coaxial waveguide 66, the wavelength of the microwaves is shortened by the wavelength-shortening member 60, and the microwaves having the shortened wavelength are supplied into the processing space S, and plasma is generated in the processing space S by the microwaves having the shortened wavelength so as to perform film formation. The sidewall of the process container 32 is heated to a predetermined temperature by the heater rods 42 embedded in the sidewall of the process container 32.

Once the film formation method is performed using the plasma, a thin film is formed on a surface of the wafer W, and an undesired film is also formed on inner surfaces of the process container 32 and surfaces of various members in the process container 32, for example, surfaces of the holding stage 34, the elevation pins 80, and the shower head unit 78. When the undesired film falls off, particles, which cause yield reduction, are generated. Accordingly, a (dry cleaning) method of cleaning the plasma processing apparatus 30 by supplying a cleaning gas into the process container 32 to remove the undesired film is performed.

Figure 2B:
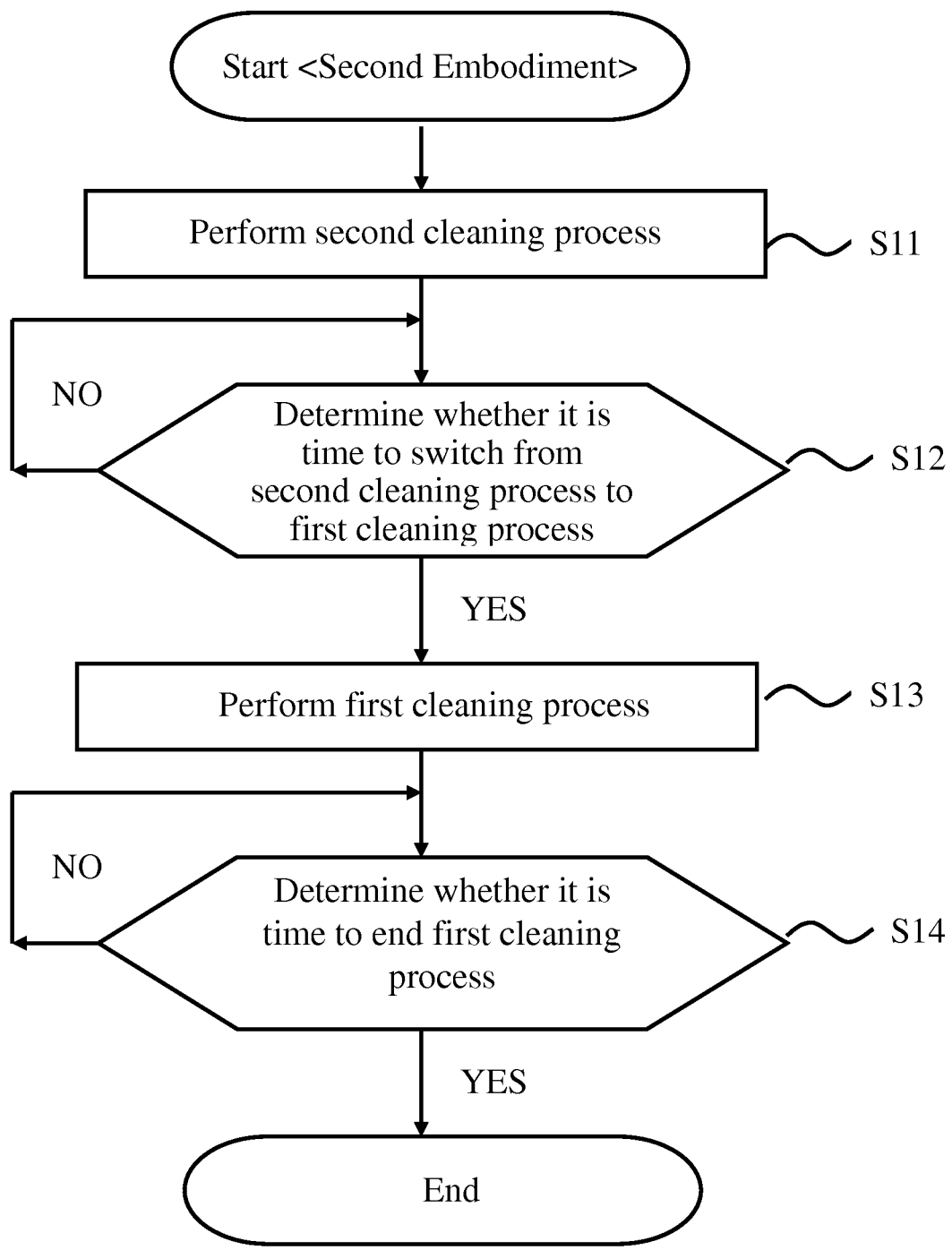
FIG. 2B is a flowchart illustrating a method of cleaning the plasma processing apparatus of FIG. 1, according to another embodiment of the present invention.
Figure 3:
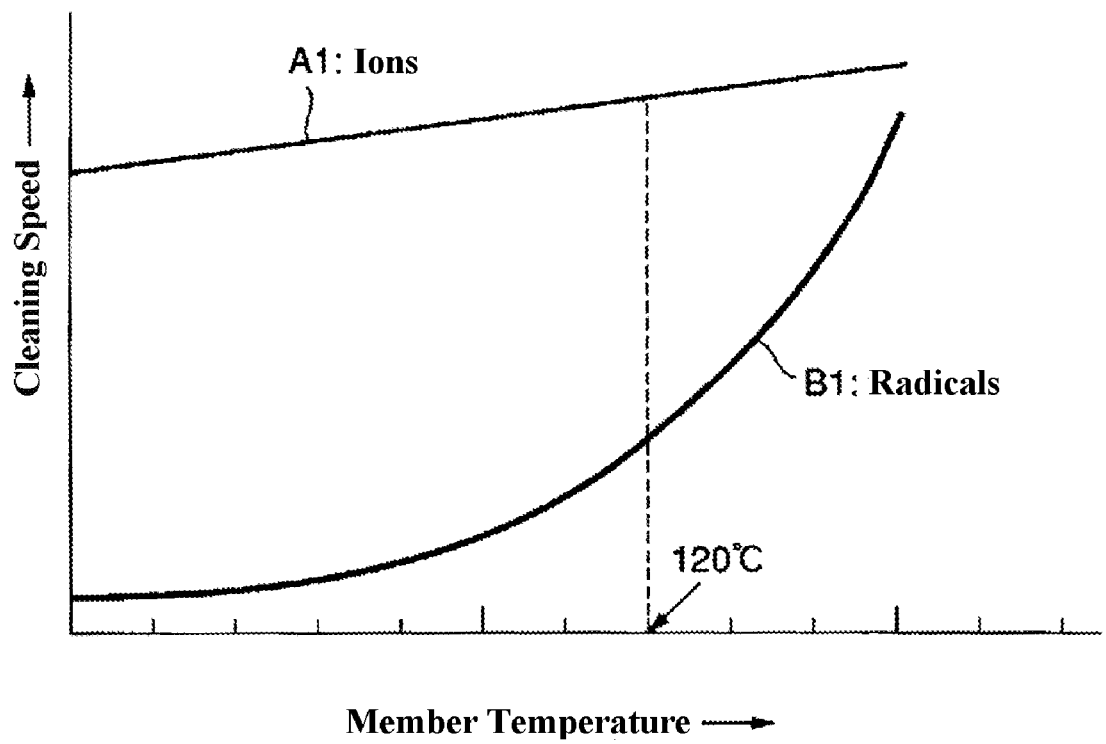
FIG. 3 is a graph illustrating a relationship between member temperature and cleaning speed.
Figure 4:
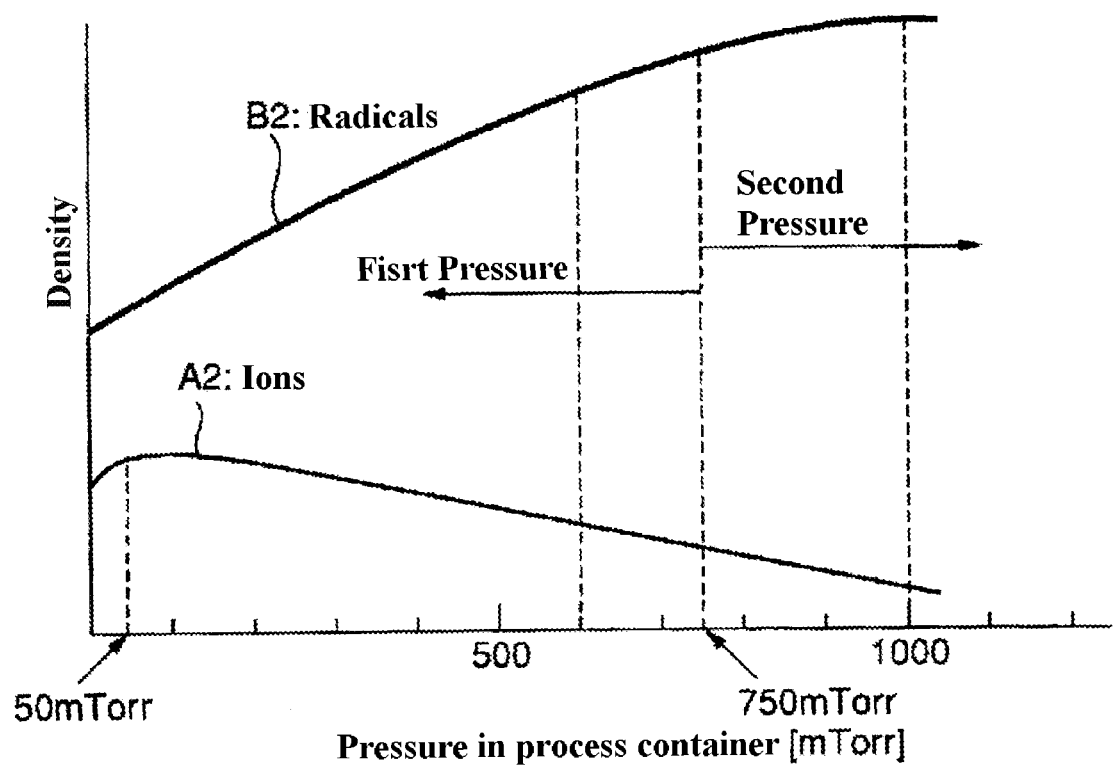
FIG. 4 is a graph illustrating a relationship between the pressure in a process container and the density of radicals and ions.
Figure 5:
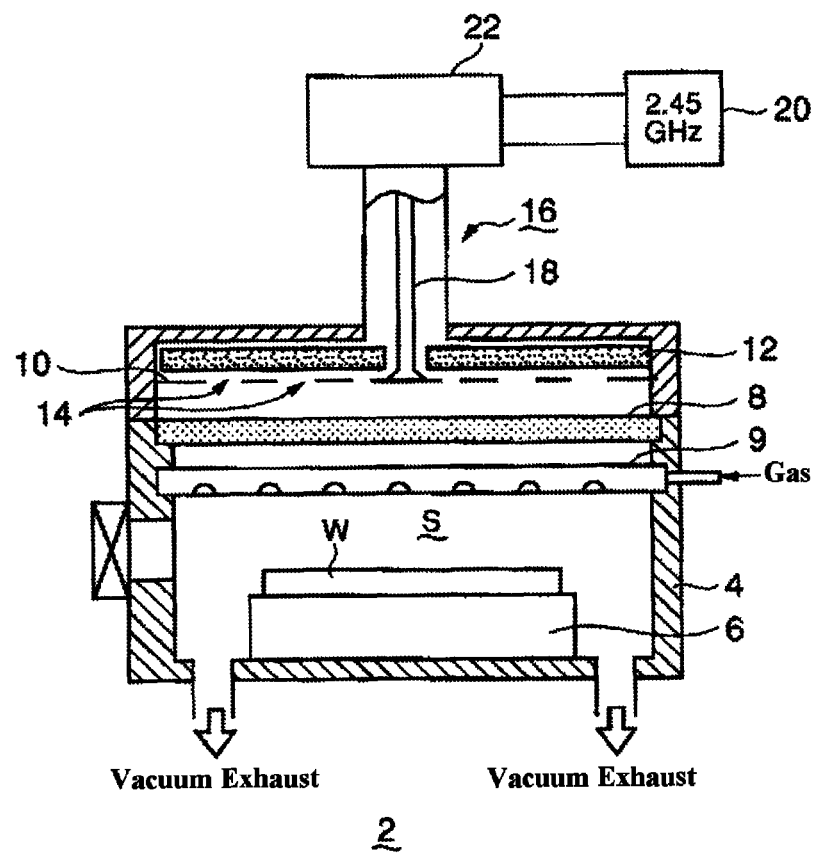
FIG. 5 is a schematic view illustrating a configuration of a conventional plasma processing apparatus using microwaves.

A method of cleaning the plasma processing apparatus 30 of FIG. 1, according to an embodiment of the present invention, will be explained with reference to FIGS. 2A through 4. FIGS. 2A and 2B are flowcharts illustrating methods of cleaning the plasma processing apparatus 30 of FIG. 1, according to embodiments of the present invention. FIG. 3 is a graph illustrating a relationship between member temperature and cleaning speed. FIG. 4 is a graph illustrating a relationship between the pressure in the process container 32 and the density of radicals and ions.

Each of the methods of FIGS. 2A and 2B combines a cleaning process at a low pressure and a cleaning process at a high pressure in order to efficiently and rapidly clean the plasma processing apparatus 30 while preventing damage to the inner surfaces of the process container 32 and the various members in the process container 32.

In detail, a first cleaning process in which a cleaning gas is supplied into the process container 32 to generate plasma and the pressure in the process container 32 is maintained at a first pressure and a second cleaning process in which a cleaning gas is supplied into the process container 32 to generate plasma and the pressure in the process container 32 is maintained at a second pressure that is higher than the first pressure are performed.

FIG. 2A is a flowchart illustrating a method of cleaning the plasma processing apparatus 30 of FIG. 1, according to an embodiment of the present invention. While the method is being performed, a dummy wafer may be held on the holding stage 34 in order to protect the holding stage 34, or may not be placed on the holding stage 34. Since an undesired film is easily removed as the temperature of the member on which the undesired film is formed increases, at least one of the group consisting of the holding stage 34 having the heating unit 88 formed therein and the sidewall of the process container 32 having the heater rods 42 formed therein may be heated in advance.

In operation S1, a first cleaning process is performed by maintaining the pressure in the process container 32 at a first pressure that is relatively low. A cleaning gas is supplied alone or together with a rare gas for exciting plasma, such as Ar or He, from the shower head unit 78. If the undesired film to be removed is a CF-based film, the cleaning gas is $O_2$, and if the undesired film to be removed is a Si-based film, the cleaning gas is $NF_3$ or the like. However, the present invention is not limited thereto, and the cleaning gas may vary according to the type of the undesired film.

The first pressure ranges from, for example, 10 mTorr (1.3 Pa) to a value less than 750 mTorr (100 Pa), and the pressure in the process container 32 during the first cleaning process is maintained in this range. In the first cleaning process, since electron density is high and ions are mainly used to clean the plasma processing apparatus 30, irradiation energy applied to an exposed surface of a member increases and cleaning speed increases.

In operation S2, it is determined whether it is time to switch from the first cleaning process to a second cleaning process after a predetermined period of time passes. If it is determined in operation S2 that it is time to switch from the first cleaning process to the second cleaning process, the method proceeds to operation S3. In operation S3, the second cleaning process is performed.

The second cleaning process is performed by maintaining the pressure in the process container 32 at a second pressure that is higher than the first pressure. A cleaning gas, which is the same as the cleaning gas used in the first cleaning process, is supplied alone or together with a rare gas for exciting plasma, such as Ar or He, from the shower head unit 78.

The second pressure ranges from, for example, 750 mTorr (100 Pa) to 5 Torr (1333 Pa). The pressure in the process container 32 during the second cleaning process is maintained in this range.

In the second cleaning process, since radicals (active species) having low cleaning performance are mainly used to clean the plasma processing apparatus 30 as will be described later, irradiation energy applied to an exposed surface of a member decreases, the risk of damage decreases, and cleaning speed decreases.

In operation S4, it is determined whether it is time to end the second cleaning process after a predetermined period of time passes. If it is determined in operation S4 that it is time to end the second cleaning process, the cleaning process ends.

Although the first cleaning process is first performed and then the second cleaning process is performed in FIG. 2A, the present invention is not limited thereto, and the second cleaning process may be first performed and then the first cleaning process may be performed as shown in FIG. 2B. That is, referring to FIG. 2B, in operation S11, the second cleaning process is performed. In operation S12, it is determined whether it is time to switch from the second cleaning process to the first cleaning process after a predetermined period of time passes. If it is determined in operation S12 that it is time to switch from the second cleaning process to the first cleaning process, the method proceeds to operation S13. In operation S13, the first cleaning process is performed. In operation S14, it is determined whether it is time to end the first cleaning process. If it is determined in operation S14 that it is time to end the first cleaning process, the method ends. A cleaning gas used in each of the first cleaning process and the second cleaning process, and the pressure in the process container 32 of the method in FIG. 2B are the same as those used in the method of FIG. 2A.

Whether it is time to switch from the first cleaning process to the second cleaning process in FIG. 2A and whether it is time to switch from the second cleaning process to the first cleaning process in FIG. 2B may be determined by the control unit 110 based on a change in the amount of light emitted from plasma, which is obtained by the light receiver 108 disposed on the sidewall of the process container 32. In detail, there are places where the undesired film tends to be attached and other places where the undesired film is hardly attached, and the thicknesses of the undesired film are quite different according to where the undesired film is attached.

During cleaning, there are places where the undesired film is easily removed and other places where the undesired film is not easily removed. For example, since the temperature of each of the holding stage 34 including the heating unit 88 and the sidewall of the process container 32 including the heater rods 42 is high, an undesired film attached to the holding stage 34 and the sidewall of the process container 34 is easily removed. Since the temperature of each of the top plate 52 and the shower head unit 78 which do not include heaters is low, an undesired film attached to the top plate 52 and the shower head unit 78 is not easily removed.

Accordingly, while the plasma processing apparatus 30 is being cleaned, the undesired film is not simultaneously completely removed from surfaces of all of the members, but the undesired film attached to some members is completely removed to expose the surfaces of the some members whereas the undesired film is still attached to other members. Accordingly, the extent of surfaces of members exposed gradually increases, finally completely removing all of the undesired film. In this case, as the extent of surfaces of members exposed gradually increases, that is, as the extent of surfaces of members covered by the undesired film decreases, the probability that radicals or active species react with the undesired film decreases, and thereby the amount of light emitted from plasma changes.

The time to switch between the first cleaning process and the second cleaning process may be determined based on a change in the amount of light emitted from plasma, which is detected by the light receiver 108. For example, a relationship between a change in the amount of light emitted from plasma and the progress of a cleaning process may be obtained in advance, and the time when half of surfaces of all members are exposed may be determined to be the time to switch between the first cleaning process and the second cleaning process. The time to switch between the first cleaning process and the second cleaning process may vary according to a change in the amount of light emitted from plasma, which is detected by the light receiver 108.

Likewise, the time to end the method in operation S3 ro in operation S13 may be determined based on a change in the amount of light emitted from plasma, which is detected by the light receiver 108. For example, a time when the amount of light is detected when there is no undesired film may be determined to be the time to end an etching process.

Alternatively, without using the light receiver 108, the time to switch between the first cleaning process and the second cleaning process or to end the method may be determined based on the total amount of plasma processing performed on the wafer W before the method is performed.

In detail, assuming that plasma film forming is plasma processing, since the total thickness of a film formed on a single wafer by the plasma film forming process performed between a previous cleaning process and a next cleaning process can be known and the thickness of a film removed due to cleaning per unit time can also be known by experience, times taken to perform the first cleaning process and the second cleaning process can be obtained by using the total thickness of the film formed on the single wafer by the plasma film forming and the thickness of the film removed due to the cleaning per unit time, and thus a time to switch the cleaning process and a time to end the method may be determined based on the times taken to perform the first cleaning process and the second cleaning process.

Alternatively, both of the amount of light emitted from plasma which is detected by the light receiver 108 and the times taken to perform the first cleaning process and the second cleaning process may be used. For example, either the first cleaning process (operation S1) or the second cleaning process (operation S11) is first performed for a predetermined period of time based on the times taken to perform the first cleaning process and the second cleaning process, and a time to end the other cleaning method (operation S3 in FIG. 2A or operation S13 in FIG. 2B) is determined based on the amount of light emitted from plasma, which is detected by the light receiver 108.

Since the first cleaning process is performed by supplying the cleaning gas into the process container 32 to generate plasma and maintaining the pressure in the process container 32 at the first pressure and the second cleaning process is performed by supplying the cleaning gas into the process container 32 to generate plasma and maintaining the pressure in the process container 32 at the second pressure, the plasma processing apparatus 30 can be efficiently and rapidly cleaned without damaging the inner surfaces of the process container 32 and members in the process container 32.

In particular, if the first cleaning process is first performed and then the second cleaning process is performed as shown in FIG. 2A, since radicals having lower irradiation energy than ions are used in the second cleaning process, the risk that the inner surfaces of the process container 32 and the surfaces of the members in the process container 32 from which the undesired film is early removed are damaged can be reduced more effectively.

In other words, if the first cleaning process is performed after the second cleaning process as shown in FIG. 2B, since a period for which a surface of a member is exposed to ions having higher irradiation energy than radicals increases, the risk that the surface of the member is damaged increases accordingly. On the contrary, if the second cleaning process mainly using radicals is performed after the first cleaning process as shown in FIG. 2A, the risk that the surface of the member is damaged decreases.

The advantage of the combination of the first cleaning process and the second cleaning process will now be explained with reference to FIGS. 3 and 4. FIG. 3 is a graph illustrating a relationship between member temperature and cleaning speed. FIG. 4 is a graph illustrating a relationship between the pressure in the process container 32 and the density of radicals and ions. In FIG. 3, if a cleaning process mainly using ions represented by characteristic curve A1 is performed on a member, e.g., the inner surfaces of the process container 32, the holding stage 34, the top plate 52, or the shower head unit 78, even when the member temperature changes, the cleaning speed remains substantially constant.

On the contrary, if a cleaning process mainly using radicals represented by characteristic curve B1 is performed on the member, the cleaning speed is very low when the member temperature is low, but the cleaning speed sharply increases exponentially as the member temperature increases. In particular, the cleaning speed in the cleaning process mainly using the radicals represented by characteristic curve B1 at a member temperature of 120° C. or more is particularly high.

In general, since the inner surfaces of the process container 32 including the heater rods 42 and the holding stage 34 including the resistance heater 88a are to be heated to a temperature of, for example, 200° C. during cleaning, if the inner surfaces of the process container 32 including the heater rods 42 and the holding stage 34 including the resistance heater 88a are previously heated to a temperature higher than 120° C., the undesired film formed on the holding stage 34 and the inner surfaces of the process container 32 can be rapidly removed. However, since the temperature of other members, for example, the surface of the shower head unit 78 or the inner surface of the top plate 52, is about 80° C., the undesired film formed on the surface of the shower head unit 78 and the inner surface of the top plate 52 cannot be rapidly removed.

Referring to FIG. 4, when the pressure in the process container 32 is about 50 mTorr, the density of ions represented by characteristic curve A2 is the highest, and at pressures other than 50 mTorr, the density of the ions is relatively low.

The density of radicals represented by characteristic curve B2 increases as the pressure in the process container 32 increases, and the density is ultimately saturated. The density of the radicals is about 80% of saturation density at 750 mTorr or so.

It can be seen from the graphs of FIGS. 3 and 4 that when the pressure in the process container 32 is low, for example, is less than 750 mTorr, the density of ions increases, cleaning is mainly performed by using the ions (see FIG. 4), and even a member whose temperature is low can be sufficiently cleaned (see FIG. 3). However, since the ions have high irradiation energy, if a surface of the member is exposed for a long time, the risk of damage to the surface of the member increases.

Also, when the pressure in the process container 32 is high, for example, is 750 mTorr or more, cleaning is mainly performed by using radicals (see FIG. 4), and a member whose temperature is higher than 120° C. can be effectively cleaned (see FIG. 3). However, since the radicals have lower irradiation energy than the ions, even if the surface of the member is exposed for a long time, the risk of damage to the surface of the member is very low.

Accordingly, the plasma processing apparatus 30 can be efficiently and rapidly cleaned without damaging the inner surfaces of the process container 32 and the members in the process container 32 by performing the first cleaning process at the first pressure to remove the undesired film that can be removed by only ions and is easily formed on the members at low pressure and by performing the cleaning process at the second pressure that is higher than the first pressure to prevent the risk of exposing the members to the ions for a long time and to remove the undesired film that is easily formed on the members at high pressure.

In particular, if the second cleaning process at the second pressure that is higher than the first pressure is first performed after the first cleaning process at the first pressure is performed, since radicals have lower irradiation energy than ions as described above, the risk of damage to a surface of an exposed member is very low, thereby preventing damage to the member.

Considering FIG. 4, the first pressure may be less than 750 mTorr, and preferably may be 600 mTorr or less. More preferably, the first pressure may be, for example, 300 mTorr or less in order to efficiently clean the plasma processing apparatus 30. The lower limit of the first pressure which allows the plasma processing apparatus 30 to be substantially cleaned may be, for example, about 10 mTorr. The second pressure may be 750 mTorr or more as described above, and preferably may be 900 mTorr or more at which radical density is saturated. The upper limit of the second pressure which allows plasma to be generated may be, for example, about 5 Torr.

Although the plasma processing apparatus 30 uses the microwave generator 72, the present invention is not limited thereto, and the plasma processing apparatus 30 may be an inductively coupled plasma (ICP)-type plasma processing apparatus or a parallel flat plate-type plasma processing apparatus using high frequency waves of, for example, 13.56 MHz.

Although the plasma processing comprises plasma film formation, the present invention is not limited thereto. For example, since an undesired film is attached to the inner surfaces of the process container 32 or surfaces of members in the process container 32 during even plasma etching or plasma ashing, the present invention can also be applied to plasma etching or plasma ashing.

Also, although wafers have been described as being processed, the present invention is not limited thereto, and glass substrates, liquid crystal display (LCD) substrates, ceramic substrates, and the like may also be processed.

INDUSTRIAL APPLICABILITY

The present invention can be applied to plasma processing apparatuses.

The invention claimed is:

1. A method of cleaning a plasma processing apparatus for processing a target in a process container, which is vacuum-evacuatable, using plasma, the method comprising:
performing a first cleaning process by supplying a cleaning gas into the process container to generate plasma and maintaining the pressure in the process container at a first pressure, under which ions inside the process container perform more cleaning than do radicals inside the process container; and
performing a second cleaning process by supplying a cleaning gas into the process container to generate plasma, maintaining the pressure in the process container at a second pressure, under which radicals inside the process container perform more cleaning than do ions inside the process container, and heating at least one of the group consisting of a sidewall of the process container and a holding stage on which the target is held at a temperature of 120° C. or more, the second pressure being higher than the first pressure.

2. The method of claim 1, wherein the second cleaning process is performed after the first cleaning process is performed.

3. The method of claim 1, wherein the first cleaning process is performed after the second cleaning process is performed.

4. The method of claim 1, wherein the first pressure ranges from 10 mTorr to a value less than 750 mTorr, and the second pressure ranges from 750 mTorr to 5 Torr.

5. The method of claim 1, wherein a time to switch between the first cleaning process and the second cleaning process is determined based on the total amount of plasma processing performed on the target before either the earlier first cleaning process or the second cleaning process is performed.

6. The method of claim 1, wherein a time to switch between the first cleaning process and the second cleaning process is determined based on an amount of light emitted from plasma generated in the process container.

7. A computer-readable recording medium having embodied thereon a program for controlling a plasma processing apparatus to execute the method of claim 1 in order to clean the plasma processing apparatus, wherein the plasma processing apparatus comprises:
a process container that is vacuum-evacuatable;
a holding stage disposed in the process container and allowing a target to be held thereon;
a gas supplying unit supplying a gas into the process container;
a plasma generating unit generating plasma in the process container; and
a control unit controlling an overall operation of the plasma processing apparatus.

8. A method of cleaning a plasma processing apparatus for processing a target in a process container, which is vacuum-evacuatable, using plasma, the method comprising:
performing a first cleaning process by supplying a cleaning gas into the process container to generate plasma and maintaining the pressure in the process container at a first pressure, under which ions inside the process container perform more cleaning than do radicals inside the process container; and
performing a second cleaning process by supplying a cleaning gas into the process container to generate plasma, maintaining the pressure in the process container at a second pressure, under which radicals inside the process container perform more cleaning than do ions inside the process container, and heating surfaces of members provided in the plasma processing apparatus at a temperature of 120° C. or more, wherein the surfaces of the members contact the plasma inside the process container and the members include a top plate installed on a top of the process container, the second pressure being higher than the first pressure.

* * * * *